United States Patent
Schröder et al.

(10) Patent No.: US 7,085,185 B2
(45) Date of Patent: Aug. 1, 2006

(54) CIRCUIT AND METHOD FOR CONTROLLING AN ACCESS TO AN INTEGRATED MEMORY

(75) Inventors: Stephan Schröder, München (DE); Aurel von Campenhausen, Cluvenhagen (DE); Manfred Pröll, Dorfen (DE); Koen Van der Zanden, Heverlee (BE)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 10/892,251

(22) Filed: Jul. 16, 2004

(65) Prior Publication Data

US 2005/0018507 A1 Jan. 27, 2005

(30) Foreign Application Priority Data

Jul. 17, 2003 (DE) .............................. 103 32 601

(51) Int. Cl.
*G11C 7/04* (2006.01)
(52) U.S. Cl. ..................... 365/211; 365/203; 365/212
(58) Field of Classification Search ........... 365/189.01, 365/211, 212, 203, 222
See application file for complete search history.

(56) References Cited

U.S. PATENT DOCUMENTS

| 5,278,796 | A | * | 1/1994 | Tillinghast et al. ......... 365/211 |
| 5,784,328 | A | * | 7/1998 | Irrinki et al. ............... 365/222 |
| 6,240,045 | B1 | | 5/2001 | Haraguchi et al. |
| 6,434,082 | B1 | | 8/2002 | Hovis et al. |
| 6,560,164 | B1 | * | 5/2003 | Kawai et al. ............... 365/233 |
| 6,762,958 | B1 | * | 7/2004 | Schramm et al. ...... 365/189.07 |
| 6,999,355 | B1 | * | 2/2006 | Benzinger et al. ..... 365/189.09 |
| 2003/0107936 | A1 | | 6/2003 | Jung et al. |

* cited by examiner

*Primary Examiner*—Richard Elms
*Assistant Examiner*—Hien N Nguyen
(74) *Attorney, Agent, or Firm*—Edell, Shapiro & Finnan, LLC

(57) ABSTRACT

A circuit for controlling an access to an integrated memory includes a command decoder for receiving at least one external command for an access to the memory. An access controller is connected to the command decoder for receiving internal command signals, which are output by the command decoder. In the course of a memory access, the command decoder outputs a precharge command signal for precharging a row of the memory cell array of the integrated memory. A control circuit, which can determine a temperature of the memory, is designed to temporally variably influence the transmission of the precharge command signal of the command decoder to the access controller in a manner dependent on the temperature of the memory. The write recovery time tWR can be retained even for higher operating frequencies of the memory.

14 Claims, 2 Drawing Sheets

CIRCUIT AND METHOD FOR CONTROLLING AN ACCESS TO AN INTEGRATED MEMORY

CROSS REFERENCE TO RELATED APPLICATIONS

This application claims priority under 35 USC §119 to German Application No. DE 103 32601.4, filed on Jul. 17, 2003, and titled "Circuit and Method for Controlling an Access to an Integrated Memory," the entire contents of which are hereby incorporated by reference.

FIELD OF THE INVENTION

The present invention relates to a circuit for controlling an access to an integrated memory having a command decoder for receiving at least one external command for an access to the memory and having an access controller for controlling an access to memory cells of the integrated memory, and to a method for controlling an access to an integrated memory.

BACKGROUND

An integrated memory, for instance, a DRAM (Dynamic Random Access Memory), generally has a memory cell array comprising word lines (rows) and bit lines (columns). The memory cells, respectively, are arranged at crossover points of the word lines and bit lines. The memory cells, which are usually used in integrated dynamic random access memories, generally have a memory cell capacitance and a selection transistor. The memory cell capacitances are, respectively, connected via the associated selection transistor of the respective memory cell to one of the bit lines via which a data signal is read out or written in. The control input of the selection transistor is connected to one of the word lines.

During a memory access, in particular, a write access, a word line is first activated. To this end, a command decoder previously receives an external access command for an access to the memory. An access controller for controlling the access to memory cells of the integrated memory is connected to the command decoder in order to receive internal command signals, which are output by the command decoder as a result of the external access command. The activation of a word line by the access controller causes the memory cells arranged along a word line to be respectively connected conductively to a bit line via the relevant selection transistor. In this case, the stored charge is divided in accordance with the memory cell capacitance and bit line capacitance. The bit line voltage is deflected in accordance with the ratio of these two capacitances. A read/write amplifier situated at one end of the bit line compares this voltage with the constant voltage on an associated complementary bit line and amplifies the relatively low potential difference between the bit line and the complementary bit line until the bit line has reached the full signal level for the corresponding data signal. At the same time, the inverse signal levels are reached on the associated complementary bit line.

After the memory cell array has been accessed, the previously selected word lines are deactivated. To this end, in the course of the memory access, the command decoder outputs a precharge command signal for precharging the corresponding word line, as a result of which the selected word line is brought into a precharging state. In this case, a delay time must be provided between the application and writing of the last data item and the application of the precharge command signal to the access controller, i.e., the write recovery time tWR, in order to be able to ensure that the data are written reliably within the memory cell array of the memory. Once the write recovery time has elapsed, the precharge command signal can be output to the access controller.

In-this case, it should generally be noted that, as the memory temperature falls, the writing window, which is specified by the write recovery time tWR, is increasingly situated in more critical areas in which it is only just possible to reliably write data. The reason for this is that, as the memory temperature falls, the time required to write data to the memory cell array increases on account of physical effects. If, in particular, in the case of SDRAMs (Synchronous Dynamic Random Access Memory), the operating frequency of the control clock is increased further in order to increase the throughput of data, the problem arises that, as the writing window tWR, e.g., a whole number of clock periods, becomes increasingly smaller as a result, it is no longer possible, under certain circumstances, in particular at lower temperatures, to reliably write data to the memory cell array. In this case, any limitations in the operational reliability of the memory when increasing the operating frequency would have to be accepted.

SUMMARY

A circuit and a method for controlling an access to an integrated memory in which the operating frequency of the memory can be increased without having to accept limitations in the operational reliability of the memory is desirable.

A circuit for controlling access to an integrated memory can include a control circuit, which can determine a temperature of the memory. In this case, the control circuit according to the invention is designed to temporally variably influence output or transmission of the precharge command signal of the command decoder to the access controller in a manner dependent on the temperature of the memory. Controlling output or transmission of the precharge command signal of the command decoder in a temporally variable manner can influence delayed output or transmission of the precharge command signal to the access controller in a temperature-dependent manner. The writing window tWR, which, at colder temperatures, becomes more and more critical for write operations, which are to be carried out, can be extended by an additional delay time of the precharge command signal. It can be possible to enlarge the writing window tWR at lower temperatures. In this case, the total access time for a memory access can be left unchanged by, for example, shortening the subsequent precharging time (not critical at lower temperatures) of the corresponding row. The delayed output or transmission of the precharge command signal can result in an extended writing window, which can be beneficial with regard to higher operating frequencies of the memory such that the write recovery time tWR is retained even for higher operating frequencies of the memory. The operating frequency of the memory can be increased in spite of limitations in the operational reliability.

A method for controlling an access to an integrated memory can include that the command decoder receives at least one external command, for example, an external write command with a subsequent external precharging command or a combined write/precharging command (write command with so-called auto-precharge), and can generate therefrom memory-internal command signals, which can be output to the access controller by the command decoder. In this case, the precharge command signal for precharging a row of the memory cell array (organized in rows and columns) can be output to the access controller by the command decoder. Output or transmission of the precharge command signal of the command decoder to the access controller can be temporally variably influenced in a manner dependent on the temperature of the memory. The temperature can be determined, for example, by a temperature sensor. In particular, output or transmission of the precharge command signal of the command decoder to the access controller can be increasingly delayed as the temperature of the memory falls. In order to avoid extending the access time overall, a subsequent precharging time of the corresponding row can be shortened to the extent to which the output or transmission of the precharge command signal can be delayed. It can be possible to leave the cycle time for a memory cell access relatively unchanged despite output or transmission outputting or forwarding of the precharge command signal being influenced.

BRIEF DESCRIPTION OF THE FIGURES

The invention is explained in more detail below with reference to the figures which are illustrated in the drawing.

DETAILED DESCRIPTION

Figure 1:
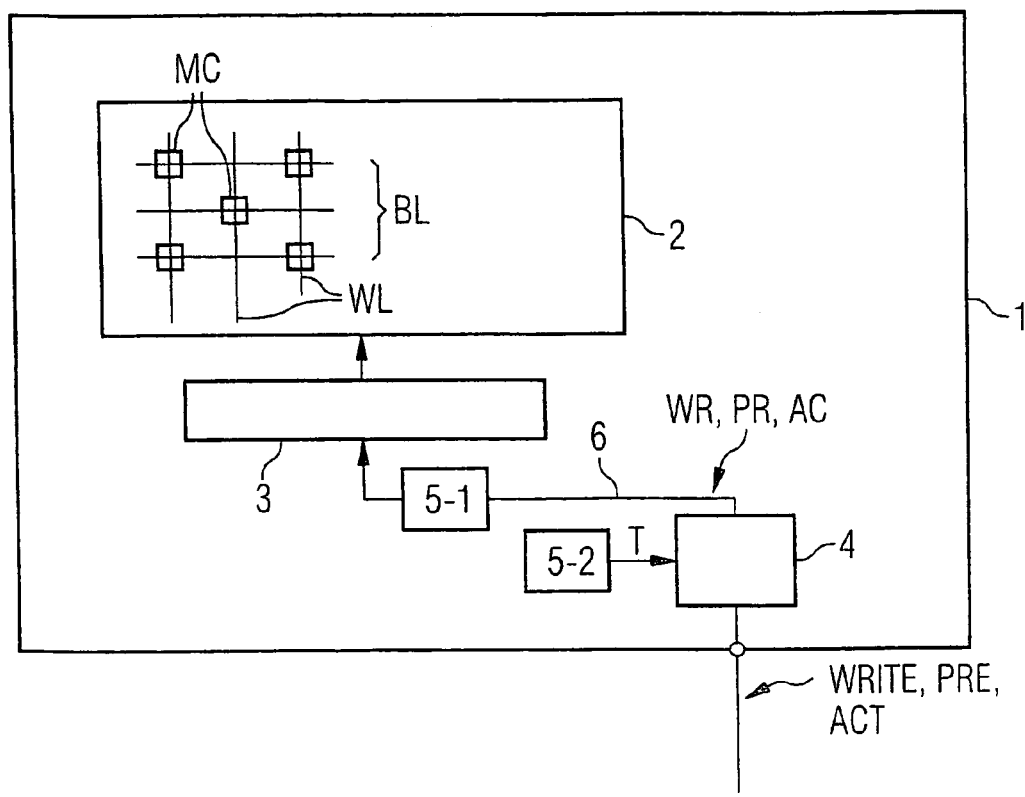
FIG. 1 shows an embodiment of a circuit for controlling an access to an integrated memory in accordance with the invention.

FIG. 1 shows an embodiment of a circuit for controlling an access to an integrated memory in accordance with the invention. The memory cell array 2 of a DRAM 1 can be organized in rows and columns in the form of a matrix. The memory cells MC can be arranged along word lines WL (rows) and bit lines BL (columns). The memory cells MC can be arranged at crossover points of the word lines and bit lines and can, respectively, include a storage capacitor and a selection transistor in the customary interconnection, which are not illustrated in FIG. 1, however, for clarity. In order to select one of the memory cells MC, the respective selection transistor can be turned on by an activated word line WL. As a result, the data signal of the selected memory cells MC along this word line can be assessed and amplified and read or written by a sense amplifier, likewise not illustrated in FIG. 1.

In order to control a memory cell access, an access controller 3, which can be connected to a command decoder 4 for receiving internal command signals WR, PR, AC, which are generated, via the command decoder 4, from external command signals. In the present exemplary embodiment, the command decoder 4 can receive for a memory access, in particular a write access, an external write command WRITE, an external precharging command PRE, and an external activation command ACT.

Figure 2:
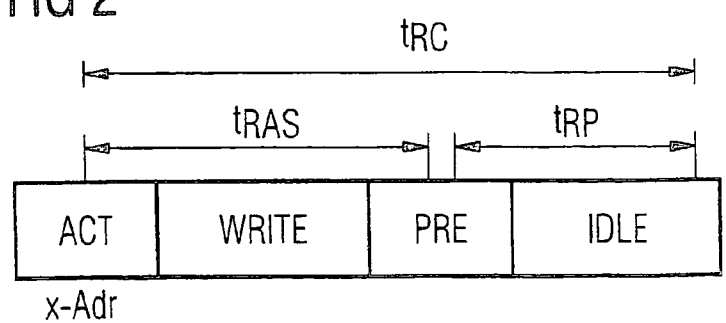
FIG. 2 shows a diagrammatic illustration of a command sequence for a memory access.

FIG. 2 shows a diagrammatic overview of an exemplary command sequence for a memory access to the DRAM 1 shown in FIG. 1. An external activation command ACT having a row address x-Adr can be passed to the memory, whereupon the command decoder 4 can output a corresponding internal activation command signal AC to the access controller 3 in order to activate the corresponding word line WL by the access controller 3. The activation command ACT can be transmitted, for example, by a memory controller (which can be externally connected to the memory), for example, for an access for writing data signals to the addressed memory row. After the activation command ACT has been applied, the external write command WRITE can be applied for a subsequent write operation, followed by an external precharging command PRE for closing and precharging the selected memory row. This command sequence indicated in FIG. 1 represents an activate-precharge cycle of a dynamic memory. This process can be concluded in the row cycle time tRC, which can include the access time tRAS (row active time) and the precharging time tRP (row precharge time).

Figure 3:
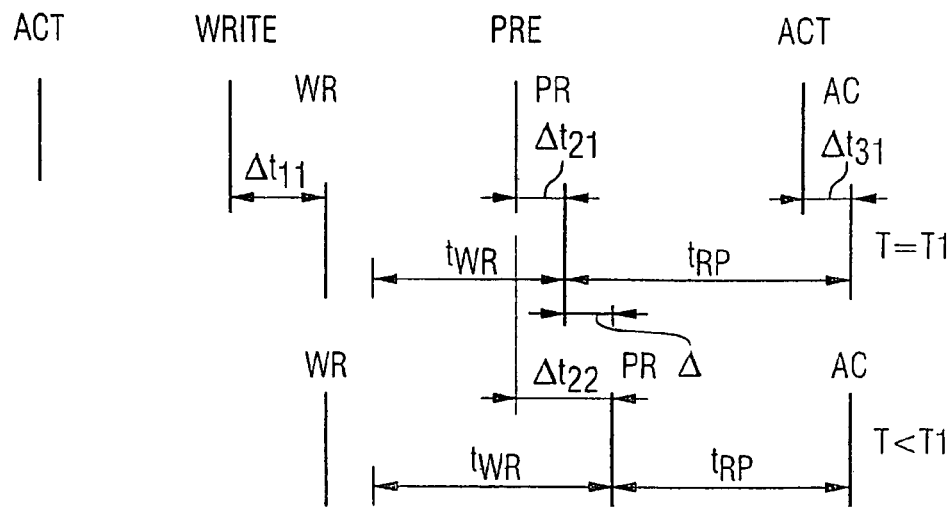
FIG. 3 shows a timing diagram for the generation of memory-internal command signals by a command decoder in response to the application of external access commands.

FIG. 3 shows a timing diagram for the generation of memory-internal command signals by the command decoder in response to the application of the above-described external access commands. In this case, as shown in FIG. 3, that a certain temporal delay can exist between the application of an external command to the memory chip and the internal execution of the command can be considered. As shown in FIG. 3, the delay between application of the external write command WRITE and output of the internal write command signal WR is designated $\Delta t11$. The delay between application of the external precharging command PRE and output of the internal precharge command signal PR is designated $\Delta t21$. The delay between application of the external activation command ACT and output of the internal activation command signal AC is designated $\Delta t31$.

After the activation command ACT for activating a memory row has been applied, application of the write command WRITE can initiate a write operation in order to write data to the selected memory row. The write recovery time tWR can begin after the last data item has been applied, after waiting out the write recovery time before the write operation has finished. Application of the precharging command PRE can precharge the selected memory row in the precharging time tRP.

Figure 4:
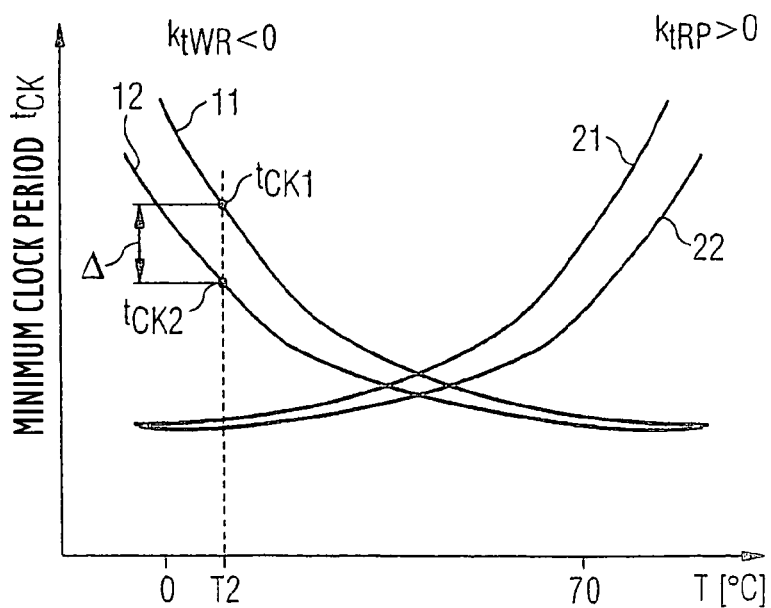
FIG. 4 shows a diagram relating to the relationship between the minimum clock period of a control clock signal and the temperature.

According to the invention, a temperature of the memory can then be determined and output or transmission of the precharge command signal PR of the command decoder 4 (as shown in FIG. 1) can be temporally variably influenced in a manner dependent on the temperature of the memory, in particular, can increasingly be delayed as the temperature of the memory falls. That is to say, as illustrated in FIG. 3, the delay time $\Delta t21$ can be increased by the additional delay $\Delta$ ($\Delta t22 = \Delta t21 + \Delta$) when a particular temperature T1 is undershot. The write recovery time tWR can be correspondingly extended by $\Delta$. The writing window (tWR), which can become relatively critical for a memory access at lower temperatures, can be extended by the additional delay time $\Delta$ of the precharging command signal PR. The writing window can thus be enlarged at low temperatures. In the present exemplary embodiment, extending the writing window at low temperatures can be at the expense of the precharging time tRP. FIG. 4 shows a diagram relating to the relationship between the minimum clock period of a control clock signal and the temperature of the memory. The maximum operating frequency (minimum clock period tCK of the clock signal CLK shown in FIG. 3) can be limited by the frequency at which the first errors occur when writing data to the memory cell array. Errors of this type occur, for example, if the specified write recovery time tWR (e.g., a whole number of clock periods) no longer suffices at high operating frequencies to reliably write data. The same applies analogously to the precharging time tRP. In the diagram shown in FIG. 4, the limiting value curve 11 can exhibit an upper limit, in accordance with which the minimum clock period tCK can be determined as a function of the temperature T of the memory. Since at lower temperatures, a larger writing window tWR is required for physical reasons, the minimum clock period tCK for low temperatures may be dimensioned to be correspondingly higher than for higher temperatures T. Since, however, the clock rate may generally not vary in a temperature-dependent manner, a minimum clock period tCK can be determined for the memory. The clock period being determined in accordance with the lowest temperature value of a specified operating range of the memory. The opposite is the case for the precharging time tRP, which requires a longer duration at higher memory temperatures on account of physical effects. The write recovery time tWR accordingly can have a negative temperature coefficient ktWR<0 and the precharging time tRP, in contrast, can have a positive temperature coefficient ktRP>0.

According to the invention, then, increasingly delaying output or transmission of the precharge command signal PR as the memory temperature falls, can correspondingly extend the write recovery time tWR by Δ. The result that the limiting value curve 11 can be shifted downward by Δ (limiting value curve 12). This can reduce the minimum clock period at the same temperature up to the first tWR-related error, illustrated in FIG. 4 using the temperature T2 as an example. According to the invention, the minimum clock period tCK1 for the temperature T2 can thus be shifted toward smaller values tCK2 by correspondingly extending the writing window tWR. An analogous relationship also applies to the limiting value curves 21 and 22 as regards varying the precharging time tRP for higher memory temperatures.

The subsequent precharging time tRP of the corresponding row can be shortened to the extent to which output or transmission of the precharge command signal PR can be delayed. The cycle time tRC for a memory cell access can thus remain relatively unchanged despite output or transmission of the precharge command signal PR of the command decoder to the access controller being influenced.

FIG. 1 shows two alternative embodiments of a circuit, which can be used to output or forward the precharge command signal PR of the command decoder 4 to the access controller 3 in a delayed manner. In a first embodiment, a temperature-dependent control circuit 5-1 is provided in the signal path 6 between the command decoder 4 and the access controller 3 in order to temporally variably influence transmission of the precharge command signal PR of the command decoder 4 to the access controller 3 in a manner dependent on the temperature of the memory. In particular, the control circuit 5-1 includes a temperature-dependent resistor, the value of which likewise changes as the memory temperature changes, in particular, changes to higher values as the memory temperature falls. Transmitting the precharge command signal PR can be thus increasingly delayed as the memory temperature falls. There may be no influence on other internal command signals.

In another embodiment of the invention, the control circuit 5-2 includes a temperature-dependent time controller and is assigned to the command decoder 4 in order to temporally variably influence output or transmission of the precharge command signal PR of the command decoder 4 to the access controller 3 in a manner dependent on the temperature of the memory. In particular, the time controller 5-2 indicates to the command decoder 4 that it should output the precharge command signal PR in an increasingly delayed manner as the memory temperature T falls.

LIST OF REFERENCE SYMBOLS

1 Dram
2 Memory cell Array
3 Access controller
4 Command decoder
5-1 Control circuit
5-2 Control circuit
6 Signal path
11, 12, 21, 22 Limiting value curve
WL Word lines (rows)
BL Bit lines (columns)
MC Memory cells
WRITE Write command
PRE Precharge command
ACT Activation command
WR Write command signal
PR Precharge command signal
AC Activation command signal
tRC Cycle time
tRAS Access time
tRP Precharging time
$\Delta t11, \Delta t21, \Delta t31, \Delta 22$ Delay time
$\Delta$ Delay time
tWR Write recovery time (writing window)
T, T1, T2 Memory temperature
tCK, tCK1, tCK2 Clock period
ktWR, ktRP Temperature coefficient
x-Adr Row address

We claim:

1. A circuit for controlling an access to an integrated memory, comprising:
a command decoder for receiving at least one external command for access to the memory;
an access controller for controlling an access to memory cells of the integrated memory, the access controller being connected to the command decoder for receiving internal command signals, the command signals being output by the command decoder, wherein, in the course of a memory access, the command decoder outputs a precharge command signal for precharging a row of a memory cell array of the integrated memory, the memory cell array being organized in rows and columns; and
a control circuit, the control circuit including means for determining a temperature of the memory, the control circuit adapted temporally variably influence output of the precharge command signal of the command decoder to the access controller in a manner dependent on the temperature of the memory.

2. The circuit as claimed in claim 1, wherein the control circuit is arranged in a signal path between the command decoder and the access controller in order to temporally variably influence output of the precharge command signal of the command decoder to the access controller in a manner dependent on the temperature of the memory.

3. The circuit as claimed in claim 2, wherein the control circuit includes a temperature-dependent resistor, a value of the resistor as the memory temperature changes.

4. The circuit as claimed in claim 2, wherein the control circuit includes a temperature-dependent resistor, the resistor changing to higher values as the memory temperature falls.

5. The circuit as claimed in claim 1, wherein the control circuit includes a temperature-dependent time controller, the control circuit is assigned to the command decoder in order to temporally variably influence output of the precharge command signal of the command decoder to the access controller in a manner dependent on the temperature of the memory.

6. A method for controlling an access to an integrated memory, comprising:
  receiving at least one external command for an access to the memory at a command decoder;
  receiving internal command signals at an access controller, the access controller being connected to the command decoder, the internal command signals being output by the command decoder and controlling access to memory cells of the integrated memory;
  the command decoder outputting a precharge command signal for precharging a row of a memory cell array of the integrated memory, the memory cell array being organized in rows and columns;
  determining a temperature of the memory;
  temporally variably influencing output of the precharge command signal of the command decoder to the access controller in a manner dependent on the temperature of the memory.

7. The method as claimed in claim 6, wherein output of the precharge command signal of the command decoder to the access controller is increasingly delayed as the temperature of the memory falls.

8. The method as claimed in claim 7, wherein a subsequent precharging time of the corresponding row is shortened to the extent to which output of the precharge command signal is delayed.

9. The method as claimed in claim 6, wherein a cycle time for a memory cell access remains relatively unchanged when output of the precharge command signal of the command decoder to the access controller is being influenced.

10. A circuit for controlling an access to an integrated memory, comprising:
  a command decoder for receiving at least one external command for access to the memory;
  an access to controller for controlling and access to memory cells of the integrated memory, the access controller being connected to the command decoder for receiving internal command signals, the command signals being output by the command decoder, wherein, in the course of a memory access, the command decoder outputs a precharge command signal for precharging a row of a memory cell array of the integrated memory, memory cell array being organized in rows and columns; and
  a control circuit, the control circuit including measurer a temperature of the memory, the control circuit adapted to temporally variably influence output of the precharge command signal of the command decoder to the access controller in a manner dependent of the temperature of the memory.

11. The circuit as claimed in claim 10, wherein the control circuit is arranged in a signal path between the command decoder and the access controller in order to temporally variably influence the output of the precharge command signal of the command decoder to the access controller in a manner dependent on the temperature of the memory.

12. The circuit as claimed in claim 11, wherein the control circuit includes a temperature-dependent resistor, a value of the resistor changing as the memory temperature changes.

13. The circuit as claimed in claim 11, wherein the control circuit includes a temperature-dependent resistor, the resistor changing to higher values as the memory temperature falls.

14. The circuit claimed in claim 10, wherein the control circuit includes a temperature-dependent time controller, the control circuit is assigned to the command decoder in order to temporally variably influence the outputting of the precharge command signal of the command decoder to the access controller in a manner dependent on the temperature of the memory.

* * * * *